United States Patent [19]

Stein

[11] 4,219,782
[45] Aug. 26, 1980

[54] UNITY GAIN AMPLIFIER FOR SOURCING CURRENT TO A CAPACITIVE LOAD OR THE LIKE

[75] Inventor: Marc T. Stein, Tempe, Ariz.

[73] Assignee: Motorola, Inc., Schaumburg, Ill.

[21] Appl. No.: 967,824

[22] Filed: Dec. 8, 1978

[51] Int. Cl.$^2$ .............................................. H03F 3/45
[52] U.S. Cl. ................................... 330/257; 330/260
[58] Field of Search ................. 330/75, 257, 260, 288, 330/293, 307, 310, 311; 307/299 B

[56] References Cited

U.S. PATENT DOCUMENTS

| | | | |
|---|---|---|---|
| 3,077,566 | 2/1963 | Vosteen | 330/260 |
| 3,932,768 | 1/1976 | Takahashi et al. | 330/257 X |

OTHER PUBLICATIONS

Ahmed "Zeno-Offset Potential Follower Circuits" RCA Technical Notes, TN No. 938, Sheets 1–7, Oct. 2, 1973.

Primary Examiner—James B. Mullins
Attorney, Agent, or Firm—Michael D. Bingham

[57] ABSTRACT

A unity gain amplifier circuit is disclosed which is responsive to an input signal being applied thereto for sourcing current to an output terminal for driving a load. The unity gain amplifier comprises a differential amplifier having first and second differential inputs at which one input thereof the input signal is applied. A current mirroring circuit is provided for producing balance current drive to the differential amplifier and which is coupled to the output thereof. The output of the differential amplifier provides base drive current to a NPN transistor which is coupled in cascode configuration to a PNP transistor. In response to the input signal being applied to the input of the differential amplifier current is sourced from the collector electrode of the PNP transistor for providing both sourcing current at the output of the unity gain amplifier and for establishing feedback to the second input of the differential amplifier such that unity gain is established.

13 Claims, 1 Drawing Figure

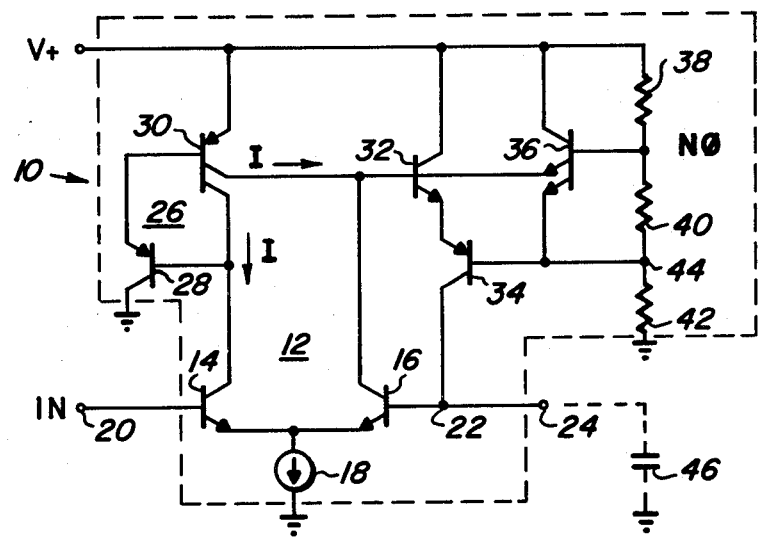

UNITY GAIN AMPLIFIER FOR SOURCING CURRENT TO A CAPACITIVE LOAD OR THE LIKE

BACKGROUND OF THE INVENTION

This invention relates to operational amplifiers and more particularly to an operational amplifier operated as a unity gain amplifier for sourcing current to capacitive loads.

Generally, unity gain or voltage follower amplifiers comprising operational amplifiers are known in the art. For example, a typical operational amplifier has positive and negative inputs and an output and can be operated in a unity gain mode by providing feedback between the output and the negative input. Moreover, operational amplifiers are generally available for both sinking and sourcing current to a load. However, typical operational amplifiers cannot source current to large capacitive loads.

Operational amplifiers available today include an emitter-follower output stage for either sourcing or sinking current to a load. Additionally, these operational amplifiers include internal capacitors for providing phase compensation to ensure stability if negative feedback is used. Therefore, if these operational amplifiers are used to drive a large capacitive load instability problems may very well occur. These instability problems arise from the fact that the large capacitive load creates a second "pole" in the transfer function of the circuit which can create an instability problem which causes oscillation.

In view of the above, it is quite apparent that typical operation amplifiers may not be useful for driving large capacitive loads. Therefore, a need exists to provide an operational amplifier which can be utilized for sourcing current only to capacitive loads.

SUMMARY OF THE INVENTION

An object of the present invention is to provide an improved unity gain amplifier for sourcing current to a load.

Another object of the present invention is to provide an improved unity gain amplifier having a high impedance output for sourcing current only to capacitive loads.

Still further, it is another object of the present invention to provide a unity gain amplifier for sourcing current to a load which is suitable to be fabricated in integrated circuit form.

The foregoing and other objects are obtained by providing an operational amplifier having feedback from the output to an input thereof to provide a unity gain function. The unity gain amplifier includes an amplifier having first and second inputs and outputs respectively which receives an input signal at the first input thereof. An output circuit is coupled from the outputs of the amplifier and has an output coupled both to the other input of the amplifier and to an output terminal which is suitable for being connected to a load. The output circuit provides a high impedance at the output and is responsive to the input signal applied at the input of the amplifier for providing current which is sourced to the load.

BRIEF DESCRIPTION OF THE DRAWING

The single FIGURE of the drawing is a schematic diagram of the preferred embodiment of the invention.

DETAILED DESCRIPTION OF THE INVENTION

Turning to the single FIGURE, there is illustrated unity gain amplifier 10 of the present invention. It is understood that unity gain amplifier 10 is suitable to be fabricated in integrated circuit form utilizing well known fabrication techniques. Unity gain amplifier 10 includes an input amplifier section 12 in the form of a differential operational amplifier. Amplifier section 12 includes differentially connected transistors 14 and 16 which have the emitter electrodes thereof coupled to a current source 18. The base electrode of transistor 14 serves as the first differential input and is connected to input terminal 20 of the unity gain amplifier. The second differential input is provided at the base electrode of transistor 16 which is connected at node 22 to the output terminal 24 of unity gain amplifier 10. The outputs of amplifier section 12 are provided at the collector electrodes of transistors 14 and 16 respectively.

Current mirror circuit 26 comprising PNP lateral transistor 28 and PNP lateral transistor 30 provides an intermediate load to differential amplifier 12. As is understood, when transistor 14 is rendered conductive by an appropriate input signal at terminal 20, equal currents of the value I are provided at the outputs of the multi-collector electrodes of transistor 30. Hence, the collector current to transistor 16 is substantially equal to the current I. In response to transistor 30 being rendered conductive, base current drive is supplied to NPN transistor 32 which is connected in cascode with PNP transistor 34 such that current is sourced to terminal 22 from the collector of transistor 34. The current sourced to terminal 22 then provides feedback to the second input of differential amplifier 12 and also sources current to a load which is connected at output terminal 24 of unity gain amplifier 10. By feeding back a portion of the output current produced at the collector of transistor 34 to the base electrode of transistor 16 the voltage differential between the base electrodes of transistors 14 and 16 are substantially kept equal and therefore unity gain is provided through the aforedescribed circuitry.

The circuitry comprising multi-emitter transistor 36 and the Nφ resistive divider network is utilized to bias the base electrode of PNP transistor 34 at a predetermined bias potential. For example, the values of resistors 38, 40 and 42 are ratioed with respect to each other such that in operation a voltage is produced across resistor 40 which is equal to the base-to-emitter voltage of transistor 36. Additionally, the current through the resistive divider Nφ network which produces the 1 VBE drop across resistor 40 also causes a 2 VBE drop to appear across resistor 38, if for example R38 is twice the magnitude of R40. Hence, a voltage is caused to appear at terminal 44, to the base electrode of transistor 34, which is 3 VBE voltage drops below the power supply potential V+. Thus, the Nφ network provides bias across transistor 34 to reduce the phase shift established therethrough in order that external capacitor 46 produces the dominant pole for the system. Moreover, the Nφ network prohibits transistor 16 from becoming saturated to insure that a high impedance is seen at node 22.

In a preferred embodiment unity gain amplifier 10 can be utilized for both detecting and maintaining the peak voltage level of the input signals applied at terminal 20. The value of the input signal will be maintained until the input signal magnitude increases to a new level which is then detected and held by unity gain amplifier 10. The aforedescribed operation takes place by connecting output terminal 24 of unity gain amplifier 10 to an external capacitive load as represented by capacitor 46. As previously mentioned the voltage appearing at terminal 22 is made equal to the voltage appearing at terminal 20 such that capacitor 46 is charged by the source current from transistor 34 to this value. Because transistor 34 can only source current to capacitor 46 if the input signal should decrease in magnitude with respect to the value of the voltage appearing across capacitor 46, this capacitor cannot be substantially discharged and will therefore hold the value that it has been charged to. However, if the input signal then increases in magnitude with respect to the value of the voltage held across capacitor 46, transistor 34 then provides additional charging current to capacitor 46 to raise it to the new value of the input signal voltage level. Capacitor 46 is prevented from discharging because the high output impedance of transistor 34 is placed in parallel therewith. This high impedance at node 22 is produced by utilizing the collector drive of PNP transistor 34. Therefore, capacitor 46 at most can only discharge due to small leakage currents which in the practical application is almost nil.

What has been described above is an improved unity gain amplifier which is useful for sampling an input signal and for holding the peak value of this signal. Further, the unity gain amplifier of the embodiment of the invention can drive large capacitive loads which are required for peak detecting input signals to the amplifier.

What is claimed is:

1. Unity gain integrated amplifier for sourcing current to a load in response to an input signal being applied to an input terminal thereof and including an output terminal; comprising:
   a differential amplifier having first and second inputs and outputs respectively, said first input being coupled to the input terminal of the unity gain amplifier; and
   output circuit means coupled to said outputs of said differential amplifier and having an output coupled both to said second input of said amplifier means and to the output terminal of the unity gain amplifier for providing internal feedback to said second input of said amplifier means and for sourcing current to the load from a high impedance source, said output circuit means including first and second transistors each having emitter, collector and base electrodes, said base electrode of said first transistor being coupled to said second output of said differential amplifier, said collector electrode of said first transistor being coupled to a terminal at which is supplied a source of operating potential, said emitter electrode of said first transistor being coupled to said emitter electrode of said second transistor, said collector electrode of said second transistor being coupled to said output of said output circuit means and said base electrode of said second transistor receiving a predetermined bias potential.

2. The unity gain amplifier of claim 1 wherein:
   said differential amplifier includes third and fourth transistors each having base, emitter and collector electrodes, said base electrodes of said third and fourth transistors being said first and second inputs of said differential amplifier respectively, said collector electrodes of said third and fourth transistors being said outputs, said emitter electrodes being interconnected to each other; and
   current means coupled between said interconnected electrodes of said third and fourth transistors and a ground reference terminal which is adapted to be connected to a ground potential.

3. The unity gain amplifier of claim 2 wherein said output circuit means includes:
   load circuit means coupled to said collectors of said third and fourth transistors and having an output; and
   bias current means having a first output coupled to said base electrode of said second transistor for providing said predetermined bias potential thereto.

4. The unity gain amplifier of claim 3 wherein said load circuit means comprising current mirroring means including:
   a fifth transistor having base, emitter and collector electrodes, said base electrode being coupled to said collector electrode of said third transistor of said differential amplifier, said collector electrode being coupled to said ground potential terminal; and
   a sixth transistor having base, emitter and two collector electrodes, said base electrode being coupled to said emitter electrode of said fifth transistor, said two collector electrodes being coupled to said collector electrodes of said third and fourth transistors of said differential amplifier respectively and said second one of said collector electrodes being said output, said emitter electrode being coupled to said source of operating potential.

5. The unity gain amplifier of claim 4 wherein said bias circuit means includes:
   resistive divider means coupled between said source of operating potential and said ground terminal for supplying first and second predetermined bias potentials at said first output and a second output thereof respectively; and
   a seventh transistor having first and second emitter, base and collector electrodes, said base electrode being coupled to said second output of said resistive divider means, said first emitter electrode being coupled to said first output of said resistive divider means and to said base electrode of said second transistor, said second emitter electrode being coupled to the output of the current mirroring circuit means, and said collector electrode being coupled to said source of operating potential.

6. Unity gain amplifier having an input and an output which is responsive to an applied input signal for sourcing current to a load that is connected to the output thereof including a differential amplifier having first and second inputs and outputs respectively, one of the inputs being coupled to the input of the unity gain amplifier, an output circuit coupled to the outputs of the differential amplifier and having an output coupled both to the second input of the differential amplifier and to the output of the unity gain amplifier, said output circuit comprising:

load circuit means coupled between the first and second outputs of the differential amplifier and a terminal at which is supplied a source of operating potential, said load circuit means having an output;

circuit means coupled between said output of said load circuit means and output of the output circuit for providing the sourcing current; and bias circuit means coupled between said terminal at which is supplied a source of operating potential and a ground terminal at which is provided a ground reference potential, said bias circuit means being coupled to said circuit means to provide a bias potential to said circuit means to aid in preventing a phase shift from being introduced to the sourcing current.

7. The unity gain amplifier of claim 6 wherein said circuit means includes:

first electron control means having first, second and control electrodes, said control electrode being coupled to said output of said load circuit means, said second electrode being coupled to said source of operating potential; and second electron control means having first, second, and control electrodes, said control electrode being coupled to said bias circuit means to receive said bias potential therefrom, said first electrode being coupled to said first electrode of said first electron control means, said second electrode being coupled to the output of the output circuit.

8. The unity gain amplifier of claim 7 wherein said load circuit means comprising current mirroring means includes:

third electron control means having first, second and control electrodes, said control electrode being coupled to the first output of the differential amplifier, said second electrode being coupled to said ground terminal; and fourth electron control means having first, second, third and control electrodes, said control electrode being coupled to said first electrode of said third electron control means, said second and third electrodes being coupled to the first and second outputs of the differential amplifier respectively and said third electrode being said output, said first electrode being coupled to said source of operating potential.

9. The unity gain amplifier of claim 8 wherein said bias circuit means includes:

resistive divider means coupled between said source of operating potential and said ground terminal for supplying first and second predetermined bias potentials at first and second outputs thereof; and fifth electron control means having first, second, third and control electrode means, said control electrode being coupled to said first output of said resistive divider means, said first electrode being coupled to said second output of said resistive divider means and to said control electrode of said second electron control means, said second electrode being coupled to the output of the current mirroring circuit means, and said third electrode being coupled to said source of operating potential.

10. The unity gain amplifier of claim 6 wherein said load circuit means comprising current mirroring means includes:

first electron control means having first, second and control electrodes, said control electrode being coupled to the first output of the differential amplifier, said second electrode being coupled to said ground terminal; and second electron control means having first, second, third and control electrodes, said control electrode being coupled to said first electrode of said first electron control means, said second and third electrodes being coupled to the first and second outputs of the differential amplifier respectively and said third electrode being said output, said first electrode being coupled to said source of operating potential.

11. The unity gain amplifier of claim 10 wherein said circuit means includes:

third electron control means having first, second and control electrodes, said control electrode being coupled to the output of said current mirroring means, said second electrode being coupled to said source of operating potential; and fourth electron control means having first, second and control electrodes, said first electrode being coupled to said first electrode of said third electron control means, said second electrode being coupled to the output of the unity gain amplifier and said control electrode being coupled to said bias circuit means at which said bias potential is applied.

12. The unity gain amplifier of claim 11 wherein said bias circuit means includes:

resistive divider means coupled between said source of operating potential and said ground terminal for supplying first and second predetermined bias potentials at first and second outputs thereof; and fifth electron control means having first, second, third and control electrode means, said control electrode being coupled to said first output of said resistive divider means, said first electrode being coupled to said second output of said resistive divider means and to said control electrode of said fourth electron control means, said second electrode being coupled to the output of the current mirroring circuit means, and said third electrode being coupled to said source of operating potential.

13. The unity gain amplifier of claim 12 wherein said third electron control means being a NPN transistor and said fourth electron control means being a PNP transistor.

* * * * *

UNITED STATES PATENT AND TRADEMARK OFFICE
CERTIFICATE OF CORRECTION

PATENT NO. : 4,219,782

DATED : August 26, 1980

INVENTOR(S) : Marc Theodore Stein

It is certified that error appears in the above-identified patent and that said Letters Patent are hereby corrected as shown below:

In column 4, line 18, claim 3, "current" should be deleted and --circuit-- substituted therefor.

Signed and Sealed this

Twenty-fifth Day of November 1980

[SEAL]

Attest:

SIDNEY A. DIAMOND

Attesting Officer

Commissioner of Patents and Trademarks